United States Patent Office 3,255,004
Patented June 7, 1966

3,255,004

PROCESS FOR PRODUCTION OF PHOTO-POLYMERIZED RELIEF IMAGES

Glen Anthony Thommes, Middletown, N.J., assignor to E. I. du Pont de Nemours and Company, Wilmington, Del., a corporation of Delaware No Drawing. Filed Feb. 1, 1962, Ser. No. 170,511
16 Claims. (Cl. 96—35)

This invention relates to processes for preparing improved polymerized elements. More particularly it relates to processes wherein the elements are obtained by photopolymerization.

Photopolymerizable compositions and elements as described in assignee's U.S. Patents Plambeck 2,760,863 and 2,791,504, Martin and Barney 2,927,022 and Martin 2,927,023 are useful in the preparation of printing reliefs. These compositions, in addition to other photopolymerizable compositions to be hereinafter described, contain inter alia, addition polymerizable ethylenically unsaturated monomeric compounds, e.g., vinylidene and vinyl monomers, preferably of the acrylic or alkacrylic ester type, an organic polymer binder or filler material and an addition polymerization initiator activatable by actinic radiation. These compositions are exposed through a suitable pattern, e.g., a process transparency, to actinic radiation in order to photopolymerize the exposed areas and, following the exposure, are treated with a solution which dissolves the composition in the unexposed areas but not in the exposed areas where polymerization of the monomer has occurred. The resulting product is a relief image element useful for printing and other applications.

Photopolymerizable compositions containing certain polymeric binders which have free carboxyl groups are converted into a soluble salt when treated with a washout solution, e.g., an alkaline solution. It is believed that the cation of the washout solution forms the salt with the binder material. During the washout operation, therefore, the converted binder is removed along with any unreacted monomeric compound. In the exposed, polymerized areas, the washout solution also has some effect, i.e., at or near the surface of the element, since the binder in these areas is at least partially converted to its corresponding salt. As a result of the surface modification, the polymerized elements have images which have increased brittleness and hardness, particularly at low humidity conditions, exhibit increased swelling in water, especially in the small highlight dot areas of halftones, and have excess cupping of small dots. Cupping is the difference in height of the dot from the edge to the center, i.e., a concave printing surface.

An object of this invention is to provide processes for preparing improved photopolymerized elements which overcome the above-enumerated disadvantages. Another object is to provide such processes which are simple and inexpensive and can be carried out with standard equipment. Still further objects will be apparent from the following description of the invention.

The above objectives of this invention are attained by treating the surface of an image comprising (1) an addition polymer obtained by imagewise photopolymerization and (2) a polymeric binder having free soluble salt groups, with an aqueous solution of 0.1 to 2.0 normal acid, preferably 0.3 to 1.0 normal acid for about 10 to 1800 seconds, preferably 30 to 300 seconds, and drying. After the acid treatment, the surface can be washed with water, e.g., for about 10 to 30 seconds, to remove any excess acid. The wash step is not required if volatile acids, e.g., hydrochloric, formic, acetic, etc., are utilized since the excess acid remaining is eliminated upon drying.

Subsequently, prior to use, the dry, acid-treated image can be post exposed by exposing it to a source of actinic radiation, e.g., for up to 20 or more minutes at room temperature or for ¼ to 15 more minutes at an elevated temperature (i.e., 70 to 100° C.).

Preferably the photopolymerizable composition useful in the invention comprises (1) An addition polymerizable, non-gaseous ethylenically unsaturated compound containing at least one terminal ethylenic group ($CH_2=C<$) having a boiling point above 100° C. at normal atmospheric pressure and being capable of forming a high polymer by free-radical initiated chain-progagating addition polymerization, and (2) A preformed, compatible macromolecular polymeric binding agent, e.g., having free carboxyl groups capable of forming salt groups in alkaline solution, e.g., cellulose acetate succinate, cellulose acetate glutarate, etc. Components (1) and (2) are present in amounts of 10 to 60 and 40 to 90 parts by weight, respectively.

Particularly preferred compositions, in addition, contain (3) A free-radical generating addition polymerization initiator activatable by actinic radiation in an amount from 0.0001 to 10 parts by weight of components (1) and (2), and, optionally, (4) a thermal addition polymerization inhibitor in an amount from 0.001 to 6 parts by weight of components (1) and (2).

The image-yielding elements useful in this invention comprise a support, e.g., a metal or polymeric sheet bearing a photopolymerizable stratum of the above-described compositions, the stratum having a thickness of up to 250 mils, e.g., about 1 to 250 mils. The elements are exposed imagewise to actinic radiation as described in the aforementioned patents; subsequently the unexposed areas are removed and the image-bearing elements treated with acid as described above followed by post exposure, if desired.

The ethylenically unsaturated Compound 1 which is capable of polymerizing or forming a high polymer in a short period of time by photoinitiated, chain-propagating, addition polymerization can be any of the monomeric compounds disclosed in Plambeck U.S. Patent 2,760,863. Preferably the compounds are non-gaseous at 20° C. and atmospheric pressure, have 1 to 4 or more terminal ethylenic groups, preferably 2 or more, and a plasticizing action on the thermoplastic polymer in addition to its other properties disclosed above. Suitable compounds, which may be used alone or in combination, include preferably an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Patent 2,927,022, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylencially unsaturated groups, especially the vinylidene groups, are conjugated with ester or amide structures. The following specific compounds are further illustrative of this class: unsaturated esters of alcohols, preferably polyols and particularly such esters of the alphamethylene carboxylic acids, e.g., Ethylene diacrylate,
Diethylene glycol diacrylate,
Glycerol diacrylate,
Glycerol triacrylate,
Ethylene dimethacrylate,
1,3-propanediol dimethacrylate,
1,2,4-butanetriol trimethacrylate, 1,4-cyclohexanediol diacrylate,
1,4-benzenediol dimethacrylate,
Pentaerythritol triacrylate and trimethacrylate,
Pentaerythritol tetraacrylate and tetramethacrylate,
1,3-propanediol diacrylate,
1,5-pentanediol dimethacrylate, the bis-acrylates and methacrylates of polyethylene glycols of molecular weight 200–1500, and the like; unsaturated amides, particularly those of the alphamethylene carboxylic acids, and especially those of alpha, omega-diamines and oxygen-interrupted omega-diamines, such as Methylene bis-acrylamide,
Methylene bis-methacrylamide,
Ethylene bis-methacrylamide,
1,6-hexamethylene bis-acrylamide,
Diethylene triamine tris-methacrylamide bis-(gamma-methacrylamidopropoxy)ethane,
Beta-methacrylamidoethyl methacrylate,
N-(beta-hydroxyethyl)-beta-(methacrylamido)ethyl acrylate and
N,N-bis(beta-methacrylyl-oxyethyl)acrylamide;
Vinyl esters such as
Divinyl succinate,
Divinyl adipate,
Divinyl phthalate,
Divinyl terephthalate,
Divinyl benzene-1,3-disulfonate,
and divinyl butane-1,4-disulfonate;

styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamines wherein the molecular chain between the hydroxyls and amino groups is solely carbon or oxygen-interrupted carbon. The preferred monomeric compounds are di- or poly-functional, but monofunctional monomers can also be used. The amount of monomer added varies with the particular thermoplastic polymer used.

Suitable binding agents (2) are those in which the free carboxyl groups of the agent are converted into a soluble salt. Such binding agents include cellulose esters made with a dicarboxylic acid, such as the preferred cellulose acetate succinate, and corresponding esters of maleic and glutaric acids as well as the esters of aromatic dicarboxylic acids, e.g., of phthalic acid, tetrahydrophthalic acid, endocis-bicyclo(2,2,1)-5-heptene-2,3-dicarboxylic acid. Additional binding agents are:

A polyvinyl alcohol derivative containing lateral free acid (e.g., oxyacid) groups which form soluble salts, more particularly the alkali metal, ammonium or substituted ammonium or amine salts, which derivative is soluble to the extent of at least 10% by weight in 2% aqueous ammonia solution as disclosed in assignee's Martin U.S. Patent 2,902,365;

A cellulose derivative containing lateral free oxyacid groups or oxyacid salt groups where the salt-forming cation is an alkali metal, e.g., lithium, sodium, potassium, or is an ammonium or substituted ammonium radical, which is soluble to the extent of at least 10% by weight in 1% aqueous ammonia solution and may contain as inert ingredients up to 35% by weight of inert organic or inorganic filler material as disclosed in assignee's Martin and Barney U.S. Patent 2,927,022.

Present in the preferred photopolymerizable compositions are photoinitiators (3) preferably those activatable by actinic light and thermally inactive at and below 185° C. which include the substituted or unsubstituted polynuclear quinones which are compounds having two intracyclic carbonyl groups attached to intracyclic carbon atoms in a conjugated carbocyclic ring system. Suitable such initiators include 9,10-anthraquinone,
1-chloroanthraquinone,
2-chloroanthraquinone,
2-methylanthraquinone,
2-ethyl-anthraquinone,
2-tert-butylanthraquinone,
Octamethylanthraquinone,
1,4-naphthoquinone,
9,10-phenanthrenequinone,
1,2-benzanthraquinone,
2,3-benzanthraquinone,
2-methyl-1,4-naphthoquinone,
2,3-dichloronaphthoquinone,
1,4-dimethylanthraquinone,
2,3-dimethylanthraquinone,
2-phenylanthraquinone,
2,3-diphenylanthraquinone,
sodium salt of anthraquinone alpha-sulfonic acid,
3-chloro-2-methylanthraquinone,
retenequinone,
7,8,9,10-tetrahydronaphthacenequinone, and
1,2,3,4-tetrahydrobenz[a]anthracene-7,12-dione.

Certain aromatic ketones, e.g., benzophenone, are also useful as are the following photoinitiators, some of which may be thermally active at temperatures as low as 85° C., e.g., those described in Plambeck U.S. Patent 2,760,863 and includes vicinal ketaldonyl compounds, such as diacetyl, benzil, etc.; alphaketaldonyl alcohols, such as benzoin, pivaloin, etc.; acyloin ethers, e.g., benzoin methyl and ethyl ethers, etc.; alphahydrocarbon substituted aromatic acyloins, including alpha-methylbenzoin, alpha-allylbenzoin, and alpha-phenylbenzoin. Silver persulfate is also useful as free-radical generating initiators activatable by actinic radiation, as are the azo initiators disclosed in assignee's Burg applications Serial No. 156,129 and 156,530, filed December 1, 1961.

Thermal polymerization inhibitors (4) are also present in the preferred compositions, including p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene, in addition to p-toluquinone and chloranil.

At least one stratum of the photopolymerizable composition is coated on a base support. Suitable bases or supports include those disclosed in U.S. Patent 2,760,863, metals, glass, wood, cellulose esters, e.g., cellulose acetate, cellulose propionate, cellulose butyrate, etc., and other plastic compositions such as polyamides, polyesters, e.g., polyethylene terephthalate, etc. The support may have in or on its surface and beneath the photopolymerizable stratum an antihalation layer as disclosed in said patent or other substrata needed to facilitate anchorage to the base, e.g., the adhesive compositions disclosed in assignee's Burg application Serial No. 750,868, filed July 25, 1958. The invention is also useful with photopolymerizable elements containing more than one stratum of photopolymerizable composition as disclosed in Plambeck U.S. Patent 2,964,401, Crawford U.S. Patent 2,993,-789 and assignee's Notley application Serial No. 788,501, filed January 23, 1959.

The photopolymerizable elements are exposed to a source of actinic radiation. This may be through a two-tone image or a process transparency, e.g., a process negative or positive (an image-bearing transparency consisting solely of substantially opaque and substantially transparent areas where the opaque areas are substantially of the same optical density, the so-called line or halftone negative or positive) or a stencil. The exposure may also be through a continuous tone, negative or positive image. The image or transparency may or may not be in operative contact with the protective cover sheet, e.g., contact exposure or projection exposure. It is possible to expose through paper or other light transmitting materials. A stronger radiation source or longer exposure times must be used, however.

Since free-radical generating addition-polymerization initiators activatable by actinic radiation generally exhibit their maximum sensitivity in the ultraviolet range, the radiation source should usually furnish an effective amount of this radiation. Both point or broad radiation sources are effective. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs, particularly the sunlamps, are most suitable. The sunlamp mercury-vapor arcs are customarily used at a distance of one and one-half to 24 inches from the photopolymerizable layer. The point sources are generally used as a distance of 20 up to about 40 inches from the photopolymerizable element. It is noted, however, that in certain circumstances it may be advantageous to expose with visible light, using a photo-initiator sensitive in the visible region of the spectrum, e.g., 9,10-phenanthrenequinone. In such cases, the radiation source should furnish an effective amount of visible radiation. Many of the radiation sources listed above furnish the required amount of visible light.

As stated previously, the photopolymerizable compositions after exposure can be developed, e.g., by impingement of spray jets, etc., including brushing or scrubbing, to desirable images with aqueous bases, i.e., aqueous solutions of water-soluble bases in concentrations generally in the range from 0.01% to 10% by weight. Higher concentrations of course can be used, but no improved result is obtained thereby. Depending upon the organic/aqueous base partition solution coefficient of the acidic polyvinyl alcohol derivatives, minor amounts of compatible organic solvents will frequently be found to be efficacious in the development medium, such as: the short chain alcohols, e.g., methyl and ethyl alcohol; the ketones, e.g., acetone, ethylmethyl ketone and cyclohexanone.

Suitable bases for the development include the alkali metal hydroxides, e.g., lithium, sodium and potassium hydroxide; the base-reacting alkali metal salts of weak acids, e.g., lithium, sodium, and potassium carbonates and bicarbonates; amines having a base-ionization constant greater than about $1 \times 10^{-6}$, e.g., primary amines, e.g., benzyl, butyl, allyl amines, and the like; secondary amines, e.g., dimethylamine and benzyl methyl amine; tertiary amines, e.g., trimethylamine, and triethylamine; primary, secondary, and tertiary hydroxyamines, e.g., propanol, diethanol and triethanol amines, and 2-amino-2-hydroxymethyl-1,3-propanediol, cyclic amines, e.g., morpholine, piperidine, piperazine, pyrrolidine, and pyridine; polyamines, such as hydrazine, ethylene and hexamethylene amines; the water-soluble, base-reacting salts, e.g., the carbonates and bicarbonates of the above amines; ammonium hydroxide and tetrahydrocarbon-substituted ammonium hydroxides, e.g., tetramethyl-, tetraethyl-, trimethylbenzyl-, and trimethylphenylammonium hydroxides; sulfonium hydroxides, e.g., trimethyl-, diethylmethyl-, dimethylbenzylsulfonium hydroxides, and the base-reacting soluble salts thereof, e.g., the carbonates, bicarbonates and sulfides; alkali metal phosphates and pyrophosphates, e.g., sodium and potassium triphosphates and sodium and potassium pyrophosphates; tetra-substituted (preferably wholly alkyl) phosphonium, arsonium, and stibonium hydroxide, e.g., tetramethylphosphonium hydroxide. For reasons of greater availability, ease in handling and low costs, the preferred bases are the alkali metal hydroxides, particularly sodium and potassium hydroxides; ammonium hydroxide; the alkali metal base-reacting salts of weak acids, especially sodium and potassium bicarbonate, and carbonate; and the hydroxyamines.

Any kind of dilute acid can be used in treating the polymerized image provided that it has no adverse effect on the polymer or the base support. Suitable acids include hydrochloric, sulfuric, phosphoric, pyrophosphoric, phosphorous, acetic, formic, oxalic, picric, trichloroacetic, chloroacetic, dicholoroacetic, lactic, maleic, malic, malonic, etc. The duration of the acid treatment can vary as indicated above and is dependent to a certain extent on the acid concentration, i.e., as the acid concentration increases the treatment time decreases. While the shortest treatment time to provide the effect is preferred, treatment above the minimum time in dilute acid within the normality range indicated is generally not harmful. Image damage can result, however, even at low acid concentrations if the treatment time is extended above the maximum time. The temperature of the acid solution during treatment can be raised above room temperature, but no improvement is attained thereby.

The addition of a wetting agent to the acid treatment solution has been found to improve the wettability of the treated surface and also to shorten the time of treatment. In addition to lauryl alcohol sulfate illustrated in the examples other useful wetting agents include: isopropyl naphthalene sodium sulfonate, sodium N-methyl-N-acyltaurate, sodium alkyl naphthalene sulfonate, alkyl naphthalene sulfonate, ethylene oxide condensates, alkyl aryl polyoxyethylene ethers, higher alkyl phenoxy polyoxyethylene ethanol and other materials effective at relatively low pH values.

The washed and dried treated polymerized element has been found to have a degree of hardness slightly less than the untreated element. Hardness can be determined by using a Knoop indentor according to the procedure described in ASTM Bull. 138, 39 (1946). While the decrease in hardness has no material effect on the effectiveness of the element, the hardness is improved by the post exposure treatments previously mentioned. Any of the radiation sources used for the imagewise exposure can be used for the post exposure. The preferred post exposure treatment is conducted at an elevated temperature, e.g., 70 to 100° C. for ¼ to 15 minutes. Within the temperature and time limits, the ethylenically unsaturated compound in the photopolymerizable composition will have a rate of conversion to the polymer of at least 90% and a yield point of at least 8000 p.s.i. Yield-point is defined in Hackh's Chemical Dictionary, 3rd edition, McGraw-Hill Book Company, Inc., New York, 1944, page 919, as "the stress at which a marked and permanent increase in the deformation of a substance occurs without an increase in the load." The time and temperature, and the results obtained by the post-exposure step can vary depending on the photopolymerizable layer, the thickness of the layer, the actinic radiation source and operating conditions used. For example, thinner layers will generally require less post exposure, but, if a different polymeric binder is utilized, the time of post exposure may have to be increased to give optimum results.

The invention will be further illustrated by, but is not intended to be limited to the following examples.

*Example I*

A photopolymerizable composition comprising 30 parts of triethylene glycol diacrylate, 67 parts of cellulose acetate succinate with a degree of acetyl substitution of 1.9 and of succinyl substitution of 0.7, 0.13 part of 2-ethylanthraquinone and 0.13 part of p-methoxyphenol, was prepared according to Smith U.S. Patent 3,012,952. This composition was pressed into a sheet of about 20-mil thickness and bonded to adhesive covered steel plates, about 10-mil thick, according to assignee's Burg application Serial No. 750,868, filed July 25, 1958. The elements formed were then exposed through a combination line and halftone photographic negative to the light of a high pressure mercury arc lamp, i.e., to 1.75 watts of actinic radiation per square inch for 14 seconds. The unpolymerized areas of the plate were then removed by spray-washing with 0.04 N sodium hydroxide solution for 3.5 minutes. The resultant relief images had well-defined characters and halftone areas.

Three of the relief image elements were soaked at room temperature in 1 normal hydrochloric acid for 1, 4 and 10 minutes, respectively, were rinsed for about 20 seconds in running water and were air dried. The dry elements and an untreated control were stored for 72 hours in a controlled atmosphere of 20% relative humidity at 76° F. The so-conditioned plates were then submitted to a bending test, i.e., they were curved uniformly to an increasingly smaller diameter with the polymer layer facing outward until the polymer began to show cracks and tears. The results are tabulated below.

PHOTOPOLYMER TREATED IN 1 NORMAL HCl

| Treatment time, minutes: | Break diameter, inches |
|---|---|
| 0 (control) | 8.1 |
| 1 | 6.2 |
| 4 | 5.9 |
| 10 | 5.7 |

Treated and untreated printing elements were mounted on a rotary printing press having a printing cylinder of 6.5 inches diameter. The untreated elements showed printing defects caused by cracks in the polymer layer when placed on the press and more defects appeared as the printing continued. The acid treated elements gave perfect prints. No cracks formed during printing.

*Example II*

A set of photopolymerized relief elements was prepared as described in Example I, except that the thickness of the photopolymerized layer was 40 mils. These plates were treated in 1.4 normal, 0.7 normal and 0.4 normal hydrochloric acid, respectively, for 30 seconds, 2 minutes and 5 minutes. To insure good wetting, 25 ml. of a 2.5% aqueous solution of technical lauryl alcohol sulfate was added to 1800 ml. of acid solution. After the acid treatment, the plates were conditioned and tested for flexibility as described in Example I. The controls were outside the range of the testing apparatus which could only measure break diameters up to 8.9 inches. All controls broke well before this bending diameter was reached. The treated plates showed the following results:

| HCl Concentration | Break Diameter After Treatment For— | | |
|---|---|---|---|
| | 30 sec. | 2 min. | 5 min. |
| | In. | In. | In. |
| 1.4 Normal | 8.7 | 8.5 | 8.5 |
| 0.7 Normal | 8.3 | 8.6 | 8.4 |
| 0.4 Normal | 8.4 | 8.2 | 8.5 |

This table shows that the break diameter is not significantly changed if the hydrochloric acid concentration is increased beyond 0.4 normal and the treatment time beyond 30 seconds.

*Example III*

A series of photopolymerized printing elements was prepared as described in Example I. The elements were then treated in a variety of different acids, as indicated in the following table. The treatment consisted of soaking the elements for 3 minutes in the acid solutions, followed by a 10-second rinse in running water, drying and conditioning for 72 hours at 20% RH and 76° F. These plates were then tested for the following properties:

(a) *Hardness.*—By means of a Knoop Indentor the Knoop Hardness Number (KHN) was determined according to ASTM Bull., 138, 39 (1946);

(b) *Highlight swelling.*—A highlight dot of 0.003 inch diameter was measured accurately. The plate was then soaked in water for 30 seconds, the excess blotted off and the dot diameter measured again without further drying.

The highlight dot swelling is expressed as percent increase after soaking in water;

(c) *Cupping.*—The difference in height of a dot of 30-mil diameter from the edge of the dot to the center was measured and expressed in mils. Where the edge is higher than the center, this phenomenon is called cupping and is given a negative sign. Where the edge is lower than the center, it is called crowning and given a positive sign.

| Plate Treatment | Acid Conc. | Hardness (KHN) | Highlight Swelling, Percent | Cupping (−) or Crowning (+), mil |
|---|---|---|---|---|
| Control | | 20.0 | 20.6 | −0.14 |
| HCl | 1 N | 15.7 | 10.7 | +0.18 |
| $H_2SO_4$ | 1 N | 16.5 | 8.8 | +0.16 |
| Acetic Acid | 1 N | 16.5 | 6.9 | +0.19 |
| Formic Acid | 1 N | 16.6 | 3.5 | +0.20 |
| Oxalic Acid | 2 N | 15.9 | 5.3 | +0.13 |
| Picric Acid | Satd | 18.2 | 13.8 | +0.19 |
| Trichloroacetic Acid | 1 N | 16.4 | 6.3 | +0.15 |

The above results indicate that the highlight swelling and cupping is improved whereas there is a slight decrease in hardness.

*Example IV*

Two sets of photopolymerized relief image elements were prepared as described in Examples I and II, the elements having respective relief heights of 20 and 40 mils. The elements were treated as follows with a single treatment or a combination of treatments, i.e., (A) The elements were placed in 0.7 normal hydrochloric acid for 3 minutes, rinsed for 10 to 20 seconds in water, dried and conditioned for 72 hours at 20% relative humidity;

(B) Post exposed for 6 minutes with a 140-amp carbon arc lamp maintained at a distance of 26 inches, the polymer being maintained at a temperature of 90° C. The treated elements and a control element exhibited the following results when bent to determine the break diameter.

| Treatment | Break Diameter (inches) | |
|---|---|---|
| | 20-mil element | 40-mil element |
| None (control) | 4.7±1.0 | |
| A | <3.5 | 7.7±0.3 |
| B | 7.6±0.4 | |
| A+B | <3.5 | 8.1±0.2 |
| B+A | <3.5 | 8.8 |

The lower and upper limits of the bending apparatus were 3.5 and 8.9 inches, respectively. The results are mean values of several determinations; the limits indicated are 95% confidence limits. Where no limits are given, a substantial number of measurements fell outside the capacity of the apparatus so that no mean value could be determined.

*Example V*

Two photopolymerized relief elements were prepared as described in Example I. Subsequently the elements were immersed in 1 normal hydrochloric acid for 4 minutes and were rinsed with water, dried and stored in a controlled atmosphere as described in Example I. One of the elements was post exposed for 1.5 minutes by means of a 6000-watt carbon arc positioned 21 inches from the image surface which was maintained at 70° C. The second element was post exposed for 3 minutes at room temperature using the carbon arc described above in this example. The post-exposed elements were used for printing with a glycol-based ink with no image breakdown being noted after at least 150,000 impressions each.

The printing reliefs made in accordance with this invention can be used in all classes of printing including lithography but are most applicable to those classes of printing wherein a distinct difference of height between printing and non-printing areas is required. These classes include those wherein the ink, e.g., glycol-based ink, is carried by the raised portion of the relief such as in dry-offset printing and ordinary letterpress printing, the latter requiring greater height differences between printing and non-printing areas and those wherein ink is carried by the recessed portions of the relief such as intaglio printing, e.g., line and inverted halftone. The plates are useful for multicolor printing. The elements are also useful in a variety of decorative and manufacturing applications including the preparation of printing matrices.

An advantage of the acid-treated elements is that they are less brittle and more flexible than comparable untreated elements. The elements can be used, especially under conditions of low humidity, on rotary presses having small diameter printing cylinders.

Another advantage of the treated elements is that they are more resistant to the pickup of moisture and therefore show less tendency to undergo surface abrasion during matrice preparation. Stereotype mats have a high moisture content. In contact with such mats the untreated elements soften rapidly because the sodium salt of cellulose acetate succinate is water sensitive. The treated surface, on the other hand, having the free acid radicals restored, is much less moisture sensitive. Though originally softer than the untreated element, it will not absorb so much water, and not soften additionally to the degree of the untreated element.

A further advantage is that the treated element shows a reduction in image cupping. The images are crown-shaped which is desirable in printing.

Additional advantages result when the elements are post exposed. Uniform chemical structure of all characters, e.g., highlight dots, halftones as well as larger image areas, is obtained. The post-exposure step equalizes the degree of polymerization between the small and large printing characters, the latter having received a significantly greater amount of actinic radiation than the former during the initial exposure step. The printing elements exhibit increased press life on flat-bed or rotary type presses over untreated elements because the characters are hard and firm due to post exposure at high temperature. The elements also exhibit improved tensile properties; and, in addition, the printing characters exhibit a decreased sensitivity to solvents and inks, particularly glycol-based inks which are used extensively in package printing. The adhesion of the photopolymerizable layer to the base support is improved. This is particularly true when photopolymerizable elements have been stored for extended periods of time, e.g., two months or more. Still further advantages will be apparent to those skilled in the art.

What is claimed is:

1. In a process for preparing a relief image element which comprises: (1) image-wise photopolymerization of a stratum comprising an addition polymerizable monomer and a polymeric binding agent having free carboxyl groups, and (2) subsequently washing said stratum with an alkaline solution to remove unexposed areas of said stratum; the improvement which consists in subsequently treating said stratum with an aqueous solution of 0.1 normal to 2 normal acid for about 10 to 1800 seconds and drying.

2. A process as defined in claim 1 wherein said acid solution is of 0.3 to 1.0 normal.

3. A process as defined in claim 1 wherein said acid treatment time ranges from 30 to 300 seconds.

4. A process as defined in claim 1 wherein said acid-treated image is washed with water for about 10 to 30 seconds.

5. A process as defined in claim 1 wherein said acid is hydrochloric acid.

6. A process as defined in claim 1 wherein said acid is sulfuric acid.

7. A process as defined in claim 1 wherein said dry, acid-treated element is post exposed to actinic radiation for up to 20 minutes.

8. A process as defined in claim 7 wherein said post exposure is for ¼ to 15 minutes at 70 to 100° C.

9. A process for preparing a relief image element having reduced brittleness and improved flexibility and moisture resistance which comprises (A) exposing with actinic radiation, imagewise, a photopolymerizable element comprising a support bearing at least one solid photopolymerizable stratum containing (1) an addition polymerizable, non-gaseous ethylenically unsaturated compound containing at least one terminal ethylenic group ($CH_2{=}C{<}$) having a boiling point above 100° C. at normal atmospheric pressure and being capable of forming a high polymer by free-radical initiated chain-propagating addition polymerization, (2) a preformed, compatible polymeric binding agent having free carboxyl groups capable of forming salt groups in alkaline solution, and (3) a free-radical generating addition polymerization initiator activatable by actinic radiation in an amount from 0.0001 to 10 parts by weight of components (1) and (2) until an insoluble image is formed in the exposed areas with essentially no polymerization in the unexposed areas, (B) removing the unexposed areas with an alkaline solvent therefor, and (C) treating said image with an aqueous solution of 0.1 to 2 normal acid for 10 to 1800 seconds and drying.

10. A process as defined in claim 9 wherein said photopolymerizable stratum contains (4) a thermal addition polymerization inhibitor in an amount from 0.001 to 6 parts by weight of components (1) and (2), said components (1) and (2) being present in 10 to 60 and 90 to 40 parts by weight, respectively.

11. A process as defined in claim 9 wherein said acid is hydrochloric acid.

12. A process as defined in claim 9 wherein said acid is sulfuric acid.

13. A process as defined in claim 9 wherein said acid-treated image is washed with water for 10 to 30 seconds.

14. A process as defined in claim 9 wherein said dry, acid-treated element is post exposed to actinic radiation for up to 20 minutes.

15. A process as defined in claim 14 wherein said post exposure is for ¼ to 15 minutes at 70 to 100° C.

16. A process as defined in claim 9 wherein said alkaline solvent is an aqueous solution of water-soluble bases in concentrations of over 0.01%.

References Cited by the Examiner

UNITED STATES PATENTS

| | | | |
|---|---|---|---|
| 2,861,058 | 11/1958 | Unruh et al. | 96—115 X |
| 2,893,868 | 7/1959 | Barney | 96—115 |

J. TRAVIS BROWN, *Acting Primary Examiner.*

HAROLD N. BURSTEIN, NORMAN G. TORCHIN, *Examiners.*